US011417849B2

(12) United States Patent
Visvanathan et al.

(10) Patent No.: US 11,417,849 B2
(45) Date of Patent: Aug. 16, 2022

(54) FABRICATION OF CORRUGATED GATE DIELECTRIC STRUCTURES USING ATOMIC LAYER ETCHING

(71) Applicant: The Regents of the University of Colorado, Denver, CO (US)

(72) Inventors: Rayshan Visvanathan, Boulder, CO (US); Diana Torres Sanchez, Lima (PE); Gregory L. Whiting, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 145 days.

(21) Appl. No.: 16/888,964

(22) Filed: Jun. 1, 2020

(65) Prior Publication Data
US 2020/0381641 A1 Dec. 3, 2020

Related U.S. Application Data

(60) Provisional application No. 62/855,661, filed on May 31, 2019.

(51) Int. Cl.
*H01L 51/05* (2006.01)
(52) U.S. Cl.
CPC ...... *H01L 51/0525* (2013.01); *H01L 51/0545* (2013.01)

(58) Field of Classification Search
CPC ......... H01L 29/42384; H01L 21/28158; H01L 21/32
See application file for complete search history.

(56) References Cited

U.S. PATENT DOCUMENTS

| 7,148,114 | B2 | 12/2006 | Chiu et al. |
| 7,265,008 | B2 | 9/2007 | King et al. |
| 8,173,499 | B2 | 5/2012 | Chung et al. |
| 8,404,594 | B2 | 3/2013 | Triyoso et al. |
| 8,946,017 | B2 | 2/2015 | Scheuerlein |
| 9,089,080 | B2 | 7/2015 | Clevenger et al. |
| 9,984,923 | B2 | 5/2018 | Briggs et al. |
| 10,096,599 | B2 | 10/2018 | Tsai et al. |
| 2014/0021448 | A1* | 1/2014 | Polander ............ H01L 51/0072 257/40 |
| 2015/0076618 | A1 | 3/2015 | Yan et al. |
| 2017/0365478 | A1* | 12/2017 | George .................... C23F 1/12 |
| 2020/0035837 | A1 | 1/2020 | Ahmed |

FOREIGN PATENT DOCUMENTS

EP 3076437 A1 * 10/2016 ......... H01L 27/1288

* cited by examiner

*Primary Examiner* — Raj R Gupta

(57) ABSTRACT

Integrated circuit structures, arrangements, and manufacturing processes are discussed herein. In one example, a method of forming a transistor structure includes forming a dielectric layer onto a gate element and forming a corrugated surface into the dielectric layer using at least an atomic layer etching (ALE) process to remove portions of the dielectric layer. The method also includes forming a semiconductor layer onto the corrugated surface and forming a source element and a drain element onto the semiconductor layer.

16 Claims, 8 Drawing Sheets

700 →

| | Planar FET | Corrugated dielectric FET |
|---|---|---|
| On current, $I_{on}$ | 18.5 µA | 72.8 µA |
| Off current, $I_{off}$ | $4.5 \times 10^{-11}$ A | $6.2 \times 10^{-11}$ A |
| On-off ratio | 411111.1 | 1174193.5 |
| Onset voltage, $V_{on}$ | 20.0 V | 18.0 V |
| Threshold voltage, $V_T$ | 27.4 V | 24.7 V |
| Mobility, $\mu_{linear}$ | 0.13 $cm^2/V \cdot s$ | 0.5 $cm^2/V \cdot s$ |

701 →

| Channel Width in Planar FETs $W$ (µm) | Total Effective Height of Corrugations, $h_{eff}$ (µm) | Total Effective Channel Width in Corrugated Dielectric FETs, $W_{eff}$ (µm) | Increase in Effective Channel Width in Corrugated Dielectric FETs (%) |
|---|---|---|---|
| 1000 | 2 | 1002 | 0.2 |
| 2000 | 4 | 2004 | 0.2 |
| 4950 | 9.9 | 4959.9 | 0.2 |

FIGURE 7

FABRICATION OF CORRUGATED GATE DIELECTRIC STRUCTURES USING ATOMIC LAYER ETCHING

RELATED APPLICATIONS

This application hereby claims the benefit of and priority to U.S. Provisional Patent Application 62/855,661, titled "FIELD-EFFECT TRANSISTOR WITH CORRUGATED GATE DIELECTRIC-SEMICONDUCTOR INTERFACE," filed May 31, 2019, which is hereby incorporated by reference in its entirety.

GOVERNMENT LICENSE RIGHTS

This invention was made with government support under grant number DMR-1420736 awarded by the National Science Foundation. The Government has certain rights in this invention.

BACKGROUND

The microfabrication of integrated circuits (ICs) requires various physical and chemical processes, which are usually carried out in a cleanroom environment. A semiconductor device, such as a transistor, consists of various layers of conductor, insulator and semiconductor that are connected with one another in a certain way. One common process used to form ICs with semiconductor materials is lithography. Lithography is the formation of three-dimensional relief images and subsequent transfer of patterns on semiconductor wafer substrates.

Optical lithography uses patterns drawn with photomasks using photo-sensitive polymers (referred to as photoresists) onto semiconductor wafers. Contact, proximity, and projection printing are example types of optical exposure in lithography. Contact printing involves direct contact between the photomask and the photoresist, but results in subsequent damage of a photomask. Proximity printing helps to decrease photomask damage by adding a small space between the photomask and photoresist. Projection printing uses multiple lenses between the photomask and substrate.

Pattern transfer from the photoresist to the underlying substrate can typically occur via subtractive transfer (etching), additive transfer (deposition), and doping (ion implantation). Once a desired pattern is developed onto a substrate after photoresist has been applied, the photoresist is then stripped or etched. Stripping of the photoresist leaves the substrate in a negative version of the patterns on the photoresist. Stripping can include wet and dry processes. Wet stripping involves using organic or inorganic chemical-based solvents. Plasma stripping typically involves a plasma that reacts with organic polymers (e.g. photoresist) while leaving the inorganic materials (e.g. silicon) largely untouched. One form of plasma stripping or etching is reactive-ion etching (RIE), which uses chemically-reactive plasma to remove material deposited on semiconductor wafers by having ions from the plasma react with a surface of the wafers. However, as features sizes of ICs continue to decrease, these aforementioned forms of etching and deposition can be difficult to control when fabricating desired features onto semiconductor wafers.

OVERVIEW

Integrated circuit structures, arrangements, and manufacturing processes are discussed herein. In one example, a method of forming a transistor structure includes forming a dielectric layer onto a gate element and forming a corrugated surface into the dielectric layer using at least an atomic layer etching (ALE) process to remove portions of the dielectric layer. The method also includes forming a semiconductor layer onto the corrugated surface and forming a source element and a drain element onto the semiconductor layer.

In another example, a semiconductor structure includes a dielectric layer, a corrugated surface formed into the dielectric layer using at least an atomic layer etching (ALE) process to remove portions of the dielectric layer, a semiconductor layer formed onto the corrugated surface.

In yet another example, a method of forming a semiconductor structure includes forming a dielectric layer, forming a first corrugated pattern with masking material on the dielectric layer, and forming a sacrificial layer onto the first corrugated pattern and the dielectric layer. The method also includes removing the masking material and at least a portion of sacrificial layer on the masking material to leave a second corrugated pattern of the sacrificial layer, and forming corrugations in the dielectric layer by at least atomic layer etching (ALE) the dielectric layer to a selected depth and concurrent with removing the second corrugated pattern.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

FIG. 7 illustrates semiconductor device characterization in an implementation.

DETAILED DESCRIPTION

Figure 1:
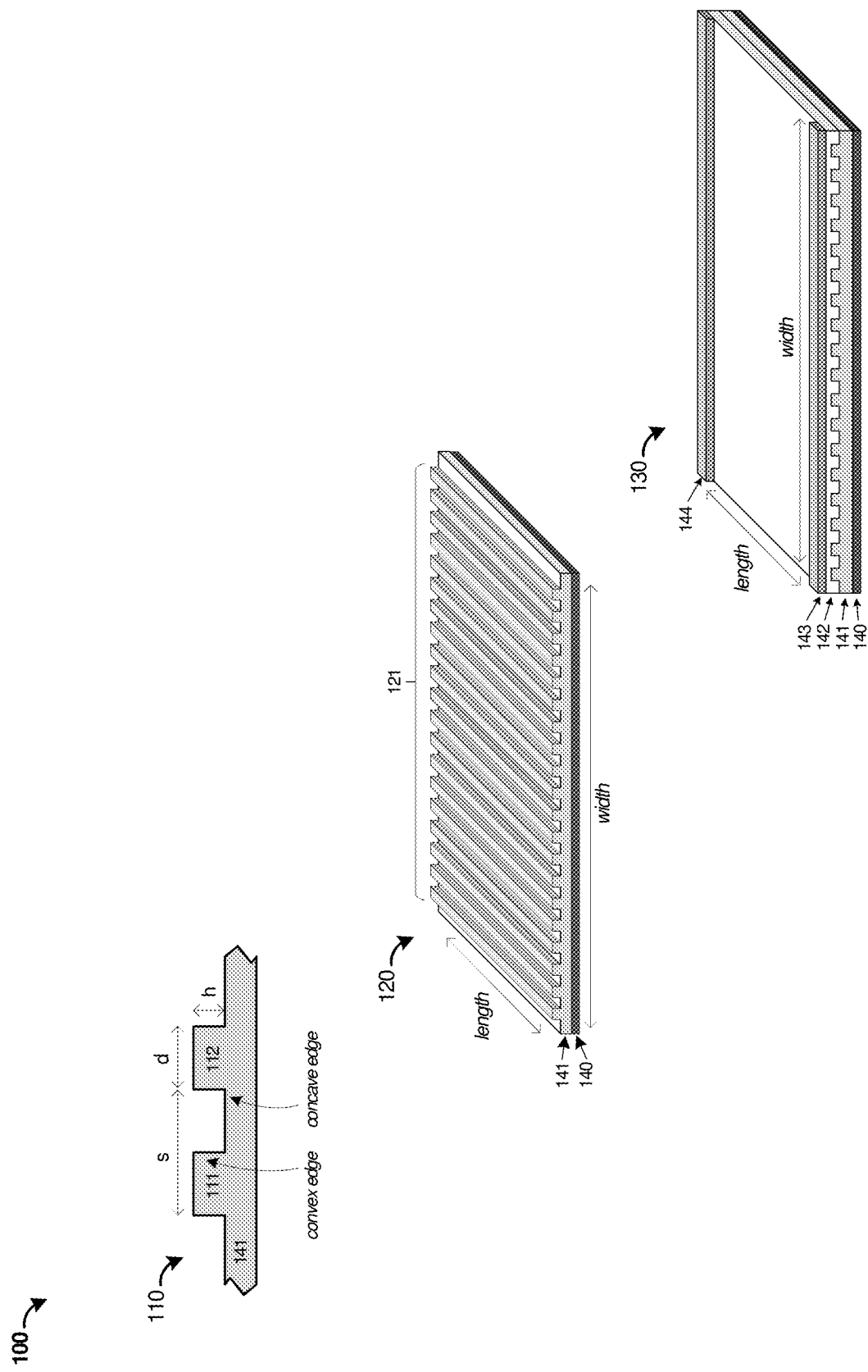
FIG. 1 illustrates semiconductor fabrication arrangements in an implementation.

Field-effect transistors (FETs), such as metal-oxide-semiconductor field-effect transistors (MOSFETs), are often employed in integrated circuits and other fabricated arrangements. Thin film field-effect transistors (TFTs), a subcategory of FETs/MOSFETs, have a unique stackup structure and are commonly employed in large-area electronics and circuits, such as liquid-crystal displays (LCDs). Individual TFTs, such as bottom-gate/top-contact TFTs, comprise a stackup formed from a dielectric (insulator) layer on top of a gate electrode and a semiconductor layer formed on top of the dielectric layer. Source and drain electrodes can deposited over or within the semiconductor layer of the aforementioned stackup to form the bottom-gate top-contact TFT structure. Organic semiconductor materials can be employed as alternatives to metal or amorphous/polycrystalline silicon based semiconductor materials in TFTs. Some example TFTs discussed herein with organic semiconductor materials comprise liquid crystalline (LC) materials. LC materials flow like liquid while maintaining phases comprising partial orientational and positional order. Highly-ordered LC phases, such as layered herringbone or certain smectic phases, can also be employed. The self-assembly of certain rod-shaped LC molecules into a layered herringbone phase results in good charge carrier mobility. Alignment of the LC molecules in the layered herringbone phase can be employed in the fabrication of organic TFTs. Although many of the examples herein discuss formation of organic TFTs, the included concepts and techniques also apply to formation of inorganic TFTs (e.g. metal or silicon based semiconductor material).

The examples herein employ enhanced TFT structures having corrugated dielectric-to-semiconductor interfaces. The dielectric surfaces in these enhanced TFTs are patterned with corrugations that run parallel to the semiconductor channel length from source to drain electrodes. The enhanced TFT structures can be made using an organic LC semiconductor material. When organic LC semiconductor material is employed, the presence of corrugations on the gate dielectric to semiconductor interface can advantageously result in self-assembly of LC semiconductor material into large and well-ordered domains. The formation of well-aligned domains can be attributed to the confinement effect imposed by the corrugations on the gate dielectric. Empirical measurements suggest an enhancement of the molecular alignment of LC materials, such as Ph-BTBT-10 (2-Decyl-7-phenyl[1]benzothieno[3,2-][1]benzothiophene), induced by the corrugated structure of the dielectric. Thermal annealing of the LC semiconductor material slightly above the smectic E (SmE) phase transition temperature enables reorganization of the LC molecules on the corrugating surface, leading to increase in domain size. In addition, the corrugations also increase the effective semiconductor channel width in the transistors. These advantages of corrugations result in higher drain currents compared to conventional planar dielectric transistors.

Atomic layer etching (ALE) or atomic layer deposition (ALD) techniques are employed herein to produce TFT structures with a corrugated gate dielectric to semiconductor interface as an approach to improve TFT device performance Other manufacturing techniques might be employed instead of ALE or ALD, such as reactive ion etching or nanoimprint lithography. However, the examples herein focus on ALE or ALD techniques which are shown to have high precision and controllability as compared to other techniques. The fabrication of a corrugated gate dielectric semiconductor interfaces using ALE and ALD techniques results in higher drain current, higher on/off ratio, higher charge carrier mobility, lower threshold voltage, and lower onset voltage compared to planar gate dielectric thin film field-effect transistors. Overall, empirical measurements discussed below suggest an effective method for morphological control and performance enhancement in organic field-effect transistors.

One example of a corrugated gate dielectric TFT is shown in FIG. 1. FIG. 1 illustrates corrugation detail 110, corrugated dielectric configuration 120, and TFT stackup 130. The examples in FIG. 1 relate to forming semiconductor structures and transistor devices, but are also applicable to other structures, devices, arrays, or integrated circuits employing such structures and devices.

Corrugation detail 110 illustrates a cross-sectional geometry of two example corrugations 111-112 within dielectric material 141. The corrugations comprise a series of concave, convex, and flat regions in which a pitch (s), width (d) and height (h) are indicated in FIG. 1. Use of corrugations may increase an effective capacitance of a TFT by a small amount after etching the corrugated structure on the gate dielectric, since TFT capacitance is inversely proportional to the dielectric thickness. However, the difference in thicknesses between a planar dielectric and a corrugated dielectric is typically very small, leading to only a small increase in capacitance. For example, an etched depth might be only 20 nanometers (nm) from a 100 nm-thick dielectric layer. Moreover, performance advantages can offset this small increase in capacitance.

Corrugated dielectric configuration 120 shows an oblique view of corrugations 121 that form ridges in a dielectric layer formed by dielectric material 141 along the length of a semiconductor channel from source to drain in a TFT. Several corrugations 121 in dielectric material 141 are shown in corrugated dielectric configuration 120, and the quantity can vary based on the desired geometry and feature sizes of the transistor structure. However, a length and width are shown in corrugated dielectric configuration 120 to indicate one example geometry/size. Corrugated dielectric configuration 120 also shows dielectric material 141 formed over a gate layer or gate element formed from gate material 140. Formation of corrugations 121 within dielectric material 141 will be discussed in the examples below.

TFT stackup 130 shows an oblique view of a TFT stackup having gate material 140, dielectric material 141, semiconductor material 142, source terminal 143, and drain terminal 144. The interface between dielectric material 141 and semiconductor material 142 comprises a corrugated interface. During formation of TFT stackup 130, dielectric material 141 is formed to have a corrugated surface, and then a semiconductor layer of semiconductor material 142 is formed onto this corrugated surface. After semiconductor material 142 is formed, then source terminal 143 and drain terminal 144 can be formed to complete the TFT stackup. TFT stackup 130 can comprise a single TFT structure employed in a single TFT device, and can be formed along with a plurality of other corrugated TFT instances to create a large array of TFT devices. This array might be employed in various electronic devices, such as display screens, solar panels, or other devices.

With regards to materials selected for elements TFT stackup 130, various selections can be made which might vary according to application as well as with changes in materials research and science. However, for purposes of example, dielectric material 141 might comprise an insulator material, such as $SiO_2$ or high-κ dielectric material. Gate material 140 can comprise highly p-doped silicon (Si) or other doping configurations and semiconductor materials. Semiconductor material 142 might comprise Ph-BTBT-10, indium gallium zinc oxide (IGZO), amorphous silicon, polycrystalline silicon, or other organic and inorganic semiconductor materials. Material Ph-BTBT-10 comprises an organic p-type semiconductor material which is an SmE liquid crystalline material. Example semiconductor thicknesses can include 650 angstroms (Å), among other suitable thicknesses formed using vapor deposition or other techniques. Source terminal 143 and drain terminal 144 comprise metallic interconnect which can be formed from any suitable conductive material, such as gold (Au), aluminum (Al), silver (Ag), or other conductive materials. Example source terminal 143 and drain terminal 144 thicknesses can include 1000 Å, among other suitable thicknesses formed by depositing thermally evaporated material.

The corrugated interface between dielectric material 141 and semiconductor material 142 is where most charge carrier transport occurs from source to drain in TFT stackup 130. The surface of dielectric material 141 may be treated with a self-assembled monolayer (SAM) of a suitable material which can behave as charge carrier trapping sites. In one example, octadecyltrichlorosilane (ODTS) may be employed between dielectric material 141 and semiconductor material 142 to make a hydrophobic surface and reduce native hydroxyl groups (e.g. SiOH). Semiconductor material 142 can then be formed, such as by vapor deposition, onto this hydrophobic surface.

Figure 2:
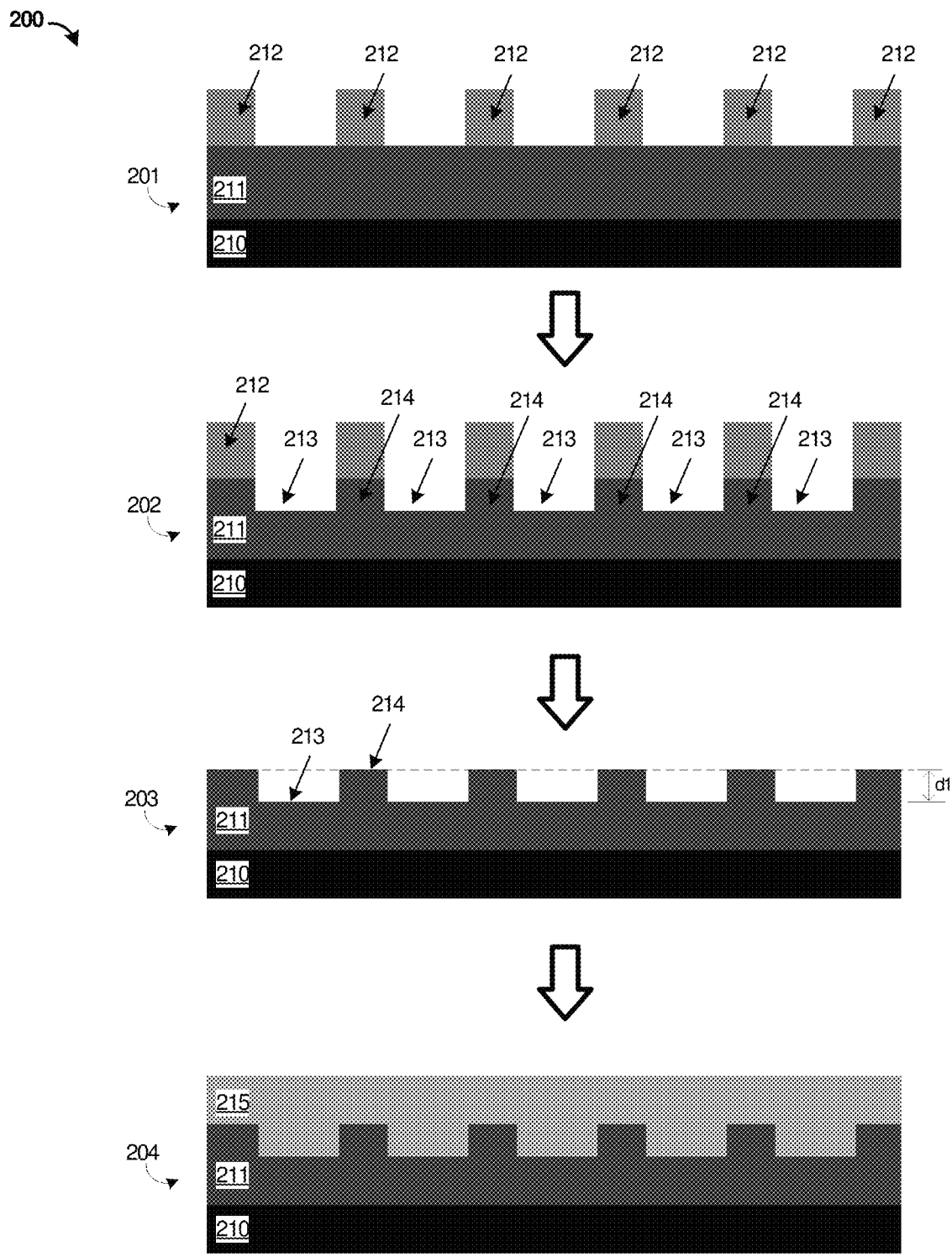
FIG. 2 illustrates semiconductor fabrication arrangements in an implementation.
Figure 3:
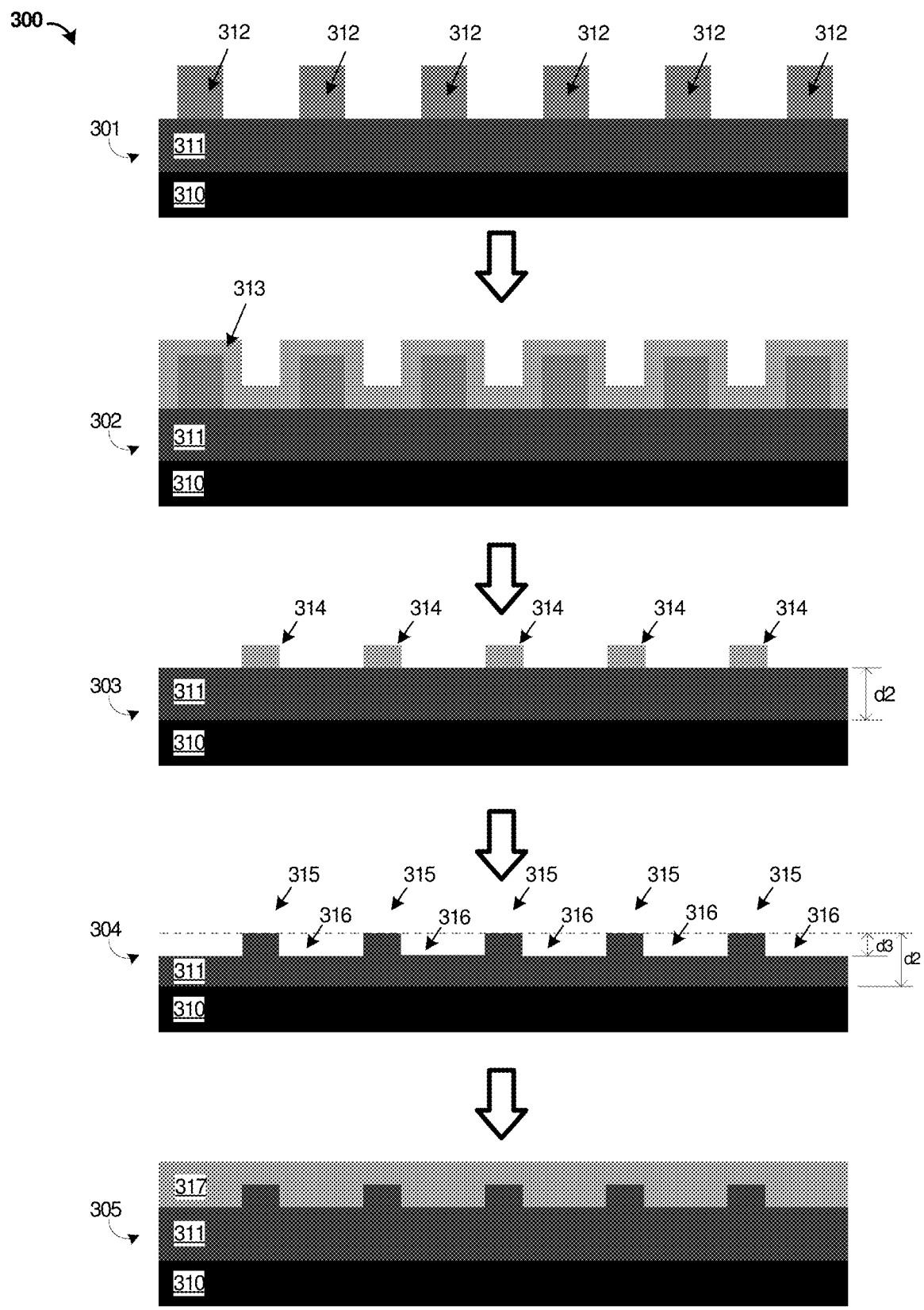
FIG. 3 illustrates semiconductor fabrication arrangements in an implementation.
Figure 4:
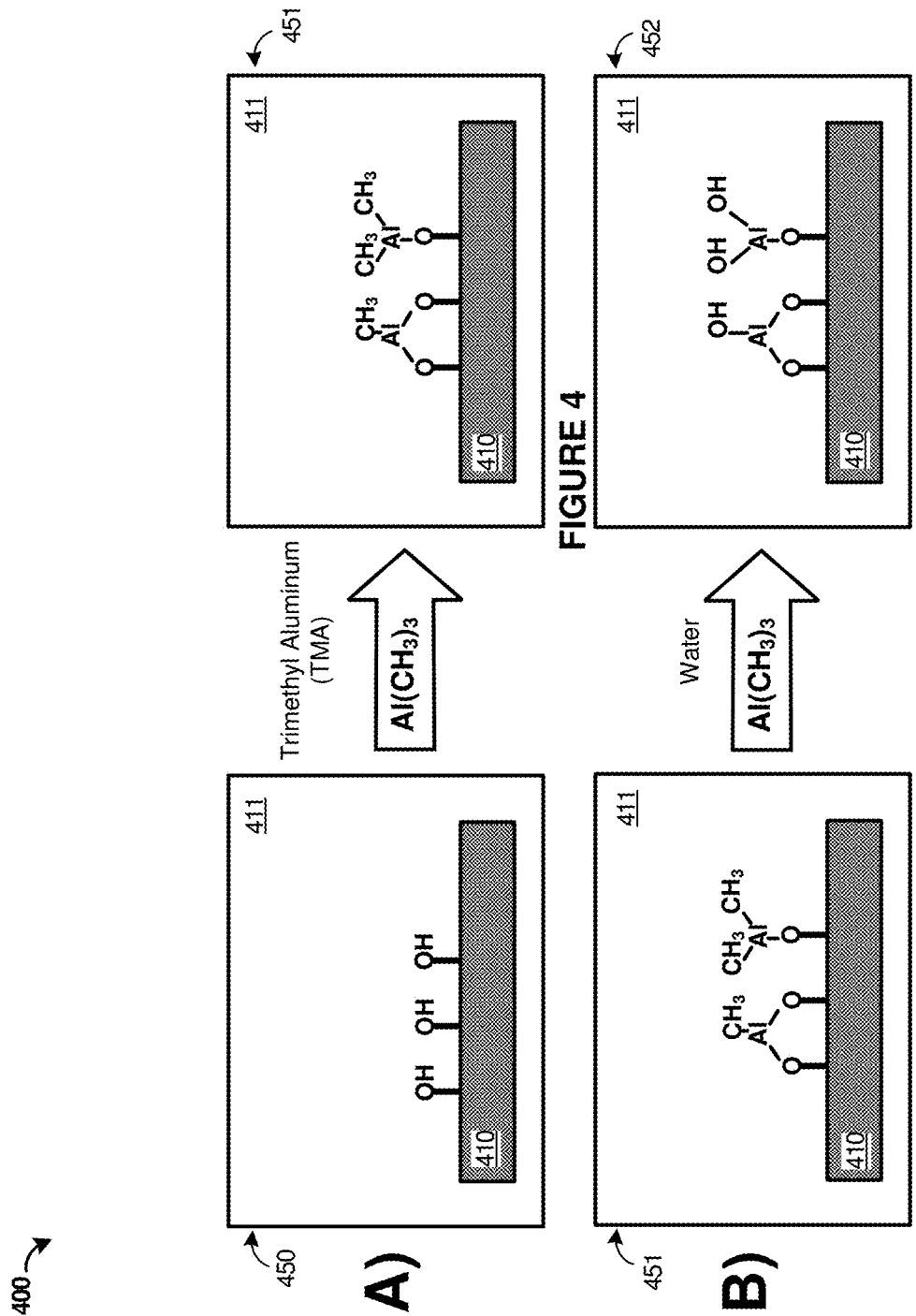
FIG. 4 illustrates semiconductor fabrication arrangements in an implementation.

Turning now to several examples on formation or manufacturing of devices which include a corrugated dielectric/semiconductor interface, FIGS. 2-4 are included. The examples below illustrate a corrugated gate dielectric-semiconductor interface, achieved using atomic layer etching (ALE) and/or atomic layer deposition (ALD). The corrugated gate dielectric-semiconductor interface can be employed in various transistor structures, such as thin film field effect transistors. While inorganic materials might be employed as the semiconductor material in such devices, the examples below are made using Ph-BTBT-10, an organic molecular semiconductor.

Turning first to FIG. 2, example semiconductor manufacturing process steps are shown utilizing enhanced techniques to create a corrugated dielectric surface for use in semiconductor structures or transistor devices. FIG. 2 illustrates process steps in relation to a cross-sectional representation of layers and features of a semiconductor structure. In summary, the operations in FIG. 2 detail forming a dielectric layer onto a gate element or gate layer, forming a corrugated surface into the dielectric layer using at least an atomic layer etching (ALE) process to remove portions of the dielectric layer, and forming a semiconductor layer onto the corrugated surface. A source element and a drain element are then formed onto the semiconductor layer.

In operation 201 of FIG. 2, gate layer 210 and dielectric layer 211 have been previously formed on a silicon wafer, such as grown using vapor deposition processes. The material of gate layer 210 might comprise p-doped Si, and the material of dielectric layer 211 might comprise $SiO_2$ or high-κ dielectric materials such as $Al_2O_3$, alumina, or hafnium, among other materials and doping configurations. Onto dielectric layer 211, several vertical masking features 212 are formed to establish a masking pattern comprising a first 'corrugated' masking arrangement. Masking features 212 will be used to define corrugations of a corrugated surface of dielectric layer 211. Masking features 212 extend into the drawing, and have a similar feature length as seen in FIG. 1 for corrugations 121. Masking features 212 can be formed from photoresist material via photomasking techniques. In one example lithographic technique, masking features 212 might comprise a negative photoresist material, such as NR-71. Before deposition of a layer of the photoresist material onto dielectric layer 211, the $SiO_2$ substrate comprising dielectric layer 211 is cleaned with solvents, such as methanol and isopropanol. The $SiO_2$ substrate can then be spin-coated with a few droplets of NR-71 at 4000 rpm for 40 seconds to create a resist layer with thickness of 1.3 μm. The $SiO_2$ substrate with the resist can be pre-baked for 60 seconds at 150° C. Then, the $SiO_2$ substrate is brought into contact with a photomask (e.g. a chromium-on-glass (COG) mask) and illuminated with i-line (365 nm) UV light for 36 seconds to form a latent image of the line patterns on the NR-71 resist layer. After UV exposure, the $SiO_2$ substrate is post-baked for 60 seconds at 100° C. The latent image on NR-71 can then be developed by immersing the substrate in RD6 developer solution for 7 seconds. After development, remaining portions of the photoresist material are shown as masking features 212. These masking features 212 will be employed as masking features for later steps. It should be understood that other lithography techniques or variations might be instead performed to form layers 210, 211, and masking features 212.

Turning now to operation 202, dielectric layer 211 is etched to a selected depth 'd1' with an atomic layer etching (ALE) process to remove the portions of dielectric layer 211 to form the corrugated surface. ALE is employed to precisely etch a selected depth with high precision, such as 20 nm+/−1 nm, among other selected depths, from dielectric layer 211 to create concave structures 213 and convex structures 214 within dielectric layer 211. ALE provides for very precise etching of a surface through a "conversion-etch" process controllable to a much finer degree than other techniques like wet etching. ALE processes comprise cyclic or repeated exposure of a surface with a first substance that reacts into a first depth of atomic layers of a material, followed by a second substance which removes the first depth of atomic layers after the atomic layers have reacted with the first substance. A purge cycle can also be performed after application of the second substance. The substances used in ALE techniques which react with the first depth of atomic layers can be self-limiting in reaction depth, so as to only react with a single atomic layer or very few atomic layers of a substrate. Etching to the selected depth with the ALE process can comprise repeated cycles among steps (a) to (d) to reach the selected depth. Steps (a) to (d) comprise (a) exposure to trimethylaluminum (TMA); (b) purging with inert gas; (c) exposure to hydrogen fluoride (HF); and (d) purging with the inert gas.

In one example, after patterning the photoresist comprising feature 212 using UV-photolithography, the $SiO_2$ substrate can be etched in a thermal ALE process in a reactor vessel. The reactor vessel may comprise a stainless steel hot wall tube reactor at 250° C. Etching with ALE can be accomplished through subsequent static exposures of TMA (trimethylaluminum 97%) and hydrogen fluoride (HF) from an HF-pyridine source (70 wt % HF). $N_2$ can be employed as a purge gas with purge flow pressures of 1 Torr. Each reactant exposure might consist of 500 mTorr transient static doses, on top of 1 Torr $N_2$ pressure, held for 2 seconds followed by a 5 second purge, so that one cycle consists of a 2 second TMA exposure, a 5 second $N_2$ purge, a 2 second HF exposure, and another 5 second purge. Samples can be etched for 500 cycles leading to 20.38 nm of $SiO_2$ removed. The first TMA exposure converts the surface $SiO_2$ to $Al_2O_3$. Subsequent HF exposure fluorinates the $Al_2O_3$ surface to make $AlF_3$. The following TMA exposures, during subsequent cycles, will then remove aluminum fluoride species through a ligand-exchange transmetalation reaction, while also converting more of the $SiO_2$ surface to $Al_2O_3$.

After the ALE process in operation 202 that forms concave structures 213 and convex structures 214, operation 203 removes masking material remaining on dielectric layer 211. The masking material comprises masking features 212 to reveal corrugations formed in dielectric layer 211 by alternating concave structures 213 and convex structures 214. Masking features 212 might be chemically removed from dielectric layer 211, such as by photomask removal processes. Operation 204 shows semiconductor layer 215 deposited onto dielectric layer 211, which fills in concave structures 213 of the corrugations. In one example, Ph-BTBT-10 semiconductor can be vapor deposited onto the corrugated $SiO_2$ dielectric surface. Finally, source and drain electrodes can be deposited onto the top surface of semiconductor layer 215, such as seen in FIG. 1. These source and drain terminals can comprise a conductive material of a certain thickness, such as 100 nm of gold. Once the source and drain terminals are completed, then the resultant structure comprises a corrugated dielectric FET.

Turning now to FIG. 3, semiconductor manufacturing process steps are shown utilizing enhanced techniques in another approach to create a corrugated dielectric surface for use in semiconductor structures or transistor devices. FIG. 3 illustrates process steps in relation to a cross-sectional representation of layers and features of a semiconductor structure. In summary, the operations in FIG. 3 detail forming a first corrugated pattern with masking material on a dielectric layer, forming a sacrificial layer of metal oxide onto the first corrugated pattern and the dielectric layer, and then removing the masking material and at least a portion of sacrificial layer on the masking material to leave a patterning of the sacrificial layer defining corrugations on the dielectric layer. With an atomic layer etching process, FIG. 3 illustrates etching the dielectric layer to a selected depth while concurrently removing the patterning of the sacrificial layer to form the corrugated surface in the dielectric layer. A semiconductor layer can be formed onto the corrugated surface, along with a source element and a drain element formed onto the semiconductor layer.

In operation 301 of FIG. 3, gate layer 310 and dielectric layer 311 have been previously formed on a silicon wafer, such as grown using vapor deposition processes. The material of gate layer 310 might comprise p-doped Si, and the material of dielectric layer 311 might comprise $SiO_2$ or high-κ dielectric materials, such as $Al_2O_3$, alumina, or hafnium, among other materials and doping configurations. Onto dielectric layer 311, several vertical masking features 312 are formed. Masking features 312 extend into the drawing, and have a similar feature length as seen in FIG. 1 for corrugations 121. Masking features 312 can be formed from photoresist material via photomasking techniques such as those discussed above for features 212 of FIG. 2.

In operation 302, an ALD process is employed to deposit a metal oxide, such as $Al_2O_3$, with a binary reaction comprising repeated cycles among steps (a) to (d) to reach a selected thickness of the metal oxide. Steps (a) to (d) comprise (a) exposure to trimethylaluminum (TMA); (b) purging with inert gas; (c) exposure to water; and (d) purging with inert gas. A thickness of the sacrificial layer is selected to correspond approximately to reaching a selected corrugation depth in the dielectric layer at completion of removal of the sacrificial layer. Layer 313 comprising $Al_2O_3$ is deposited over dielectric layer 311 and masking features 312. Layer 313 is deposited as sacrificial layer using ALD techniques. After layer 313 is deposited, simultaneous ALE of $SiO_2$ and $Al_2O_3$ is performed. The selected thickness of $Al_2O_3$ is such that all of the $Al_2O_3$ will be completely etched when the corrugation depth of $SiO_2$ of dielectric layer 311 has reached 20 nm+/−1 nm. In one example, layer 313 has a thickness of 20.8 nm of $Al_2O_3$ resultant from 162 cycles of ALD at 130° C. The ALD process can be carried out in a tube reactor, similar to that discussed above.

To further clarify the ALD process of FIG. 3, a brief example is included in FIG. 4. FIG. 4 illustrates substrate 410 comprising $Al_2O_3$ within reactor 411. Two half-reactions are shown in FIG. 4, half-reaction (A) and half-reaction (B) which together perform ALD of a substrate (e.g. $Al_2O_3$) with a binary reaction of trimethylaluminum (TMA) and water. TMA comprises $Al_2(CH_3)_6$ in the dimer configuration, and is referred to as monomer $Al(CH_3)_3$ below. The total binary reaction comprises:

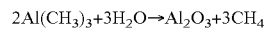

In half-reaction (A), reaction state 450 includes a surface of substrate 410 comprising AlOH is in an initial reaction state which then has $Al(CH_3)_3$ introduced (e.g. AlOH+Al$(CH_3)_3$) to produce reaction state 451 comprising AlO—Al$(CH_3)_2$+$CH_4$. In half-reaction (B), reaction state 451 has water ($H_2O$) introduced (e.g. $AlCH_3$+$H_2O$) to produce reaction state 452 comprising AlOH+$CH_4$. The binary reaction above thus can be summarized by the two separate half reactions, (A) and (B):

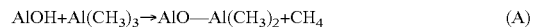

The half-reactions of FIG. 4 repeat in an A-B-A-B- . . . sequence, with an inert gas purge between each half-reaction. The overall reaction for $Al_2O_3$ ALD is very exothermic (ΔH=−376 kcal), due to the strong Al—O bond. In one example, the substrates are placed into reactor 411, and equilibrated to 130° C. for about 30 minutes. Nitrogen gas can be employed as the inert purge gas with a flow rate of 25 sccm. The pressure for TMA and $H_2O$ might be 10 mTorr during the reactions. One complete cycle of the ALD process involves four sequential steps in the tube reactor: (1) dosing of TMA for 1 seconds, (2) nitrogen gas purge for 30 seconds, (3) dosing of $H_2O$ for 1 second, and (4) nitrogen gas purge for another 30 seconds. The ALD growth rate for $Al_2O_3$ is 1.19 per cycle. Ellipsometry measurements can be performed after ALD and ALE to identify the final thickness of $Al_2O_3$.

Returning to the operations of FIG. 3, operation 303 includes liftoff of the photoresist comprising masking features 312 is performed. Remainder $Al_2O_3$ features 314 are shown, which act as masking features in operation 304. $Al_2O_3$ can provide for higher temperature masking material than typical polymer photoresist material. Thus, operations 301-303 are performed to establish a mask formed by $Al_2O_3$. Prior to operation 304, dielectric material 311 has a thickness of 'd2' shown in FIG. 3.

Turning now to operation 304, atomic layer etching (ALE) is employed to precisely etch a selected depth 'd3', such as 20 nm+/−1 nm, from dielectric material 311 to create concave structures 316 and convex structures 315 within dielectric material 311. In operation 304, ALE concurrently etches away the masking formed by $Al_2O_3$ and etches away non-masked portions of dielectric material 311. As can be seen in FIG. 3, concave structures 316 and convex structures 315 are formed into the layer of dielectric material 311 which had original thickness d2. In one example, 240 cycles of ALE are performed to achieve 20.69 nm of $SiO_2$ etched depth with all of the $Al_2O_3$ mask removed. The etch rate of $SiO_2$ is about 1 Å/cycle and $Al_2O_3$ is 1.3 Å/cycle.

After the ALE process in operation 304 corrugations are formed in dielectric material 311 by alternating concave structures 316 and convex structures 315. Operation 305 shows semiconductor material 317 deposited onto dielectric material 311, which fills in concave structures 316 of the corrugations. Ph-BTBT-10 semiconductor can be vapor deposited onto the corrugated $SiO_2$ dielectric surface. Finally, source and drain electrodes can be deposited onto the top surface of semiconductor material 317, such as seen in FIG. 1. These source and drain terminals can comprise a conductive material of a certain thickness, such as 100 nm of gold. Once the source and drain terminals are completed, then the resultant structure comprises a corrugated dielectric FET.

Figure 5:
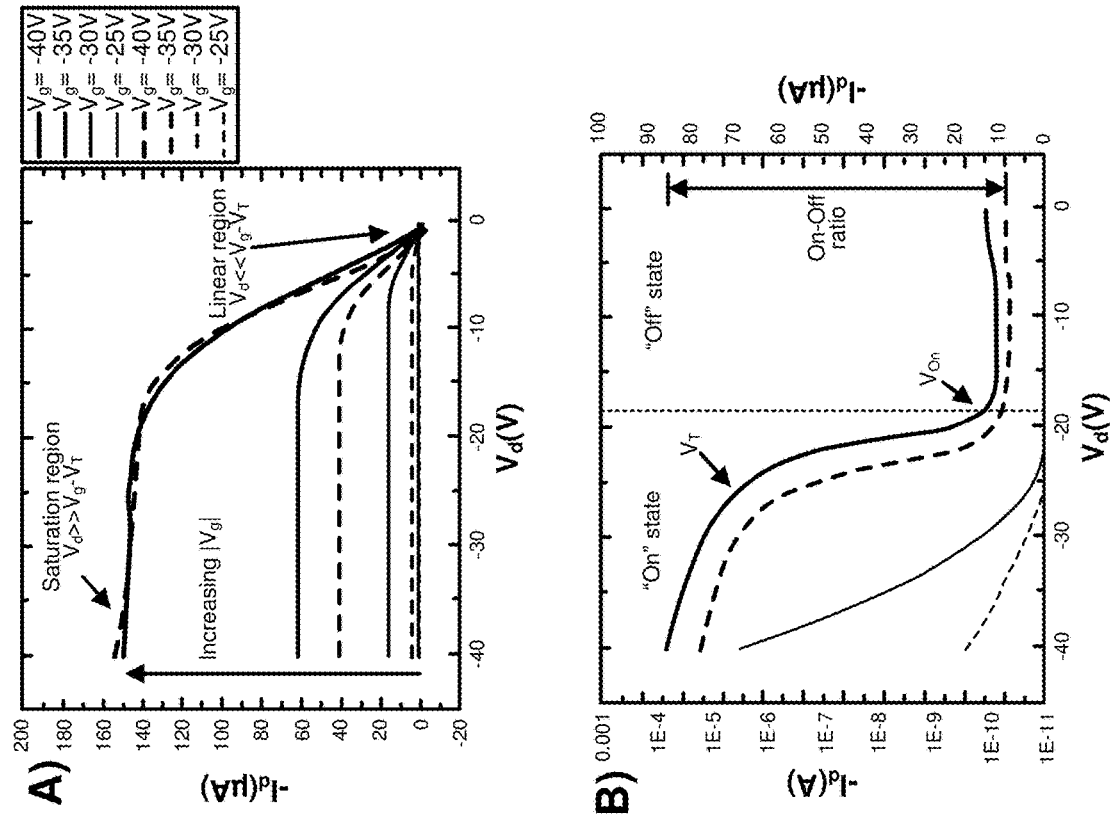
FIG. 5 illustrates semiconductor device characterization in an implementation.

Turning now to characterization of corrugated dielectric structures in TFT and FET devices, FIGS. 5-9 are presented. In FIG. 5, output and transfer measurement graphs 500 are illustrated to investigate electrical performance between conventional planar and enhanced corrugated dielectric FETs. FIG. 5 illustrates output and transfer measurements for planar and corrugated dielectric FETs. Output measurements are illustrated in graph (a) and transfer measurements are represented in graph (b) for planar and corrugated dielectric FETs. The measured planar and corrugated dielectric FETs have semiconductor channel length of 200 micrometers (μm) and width of 4950 μm. The solid lines represent corrugated dielectric FETs while the dashed lines represent planar FETs.

In the output measurements, gate voltages (Vg) are stepped from −40V to −25V in 5V steps, while sweeping drain voltages (Vd) from −40V to 0V in 2V steps. In the transfer measurements, the drain voltage (Vd) was stepped from −15V to −10V in 5V step, while sweeping the gate voltage (Vg) from −40V to 0V in 2V steps. FIG. 5 illustrates that the drain current was higher in the "on" state for the corrugated dielectric FETs than that of planar FETs. The drain current enhancement in the "on" state was about 394% in the corrugated dielectric FET than the planar FET with channel W=4950 μm and 200 μm. The drain current in the "off" state was very similar in both types of FETs, about 10-11 A. The corrugated dielectric FET showed higher on-off ratio of 1174193.5 than that of planar FET, of 411111.1. The on-off ratio is the ratio of the drain current in the "on" state at a specific gate voltage and the drain current in the "off" state (Ion/Ioff). Ideally, the on-off ratio should be as large as possible for clean switching behavior.

Figure 6:
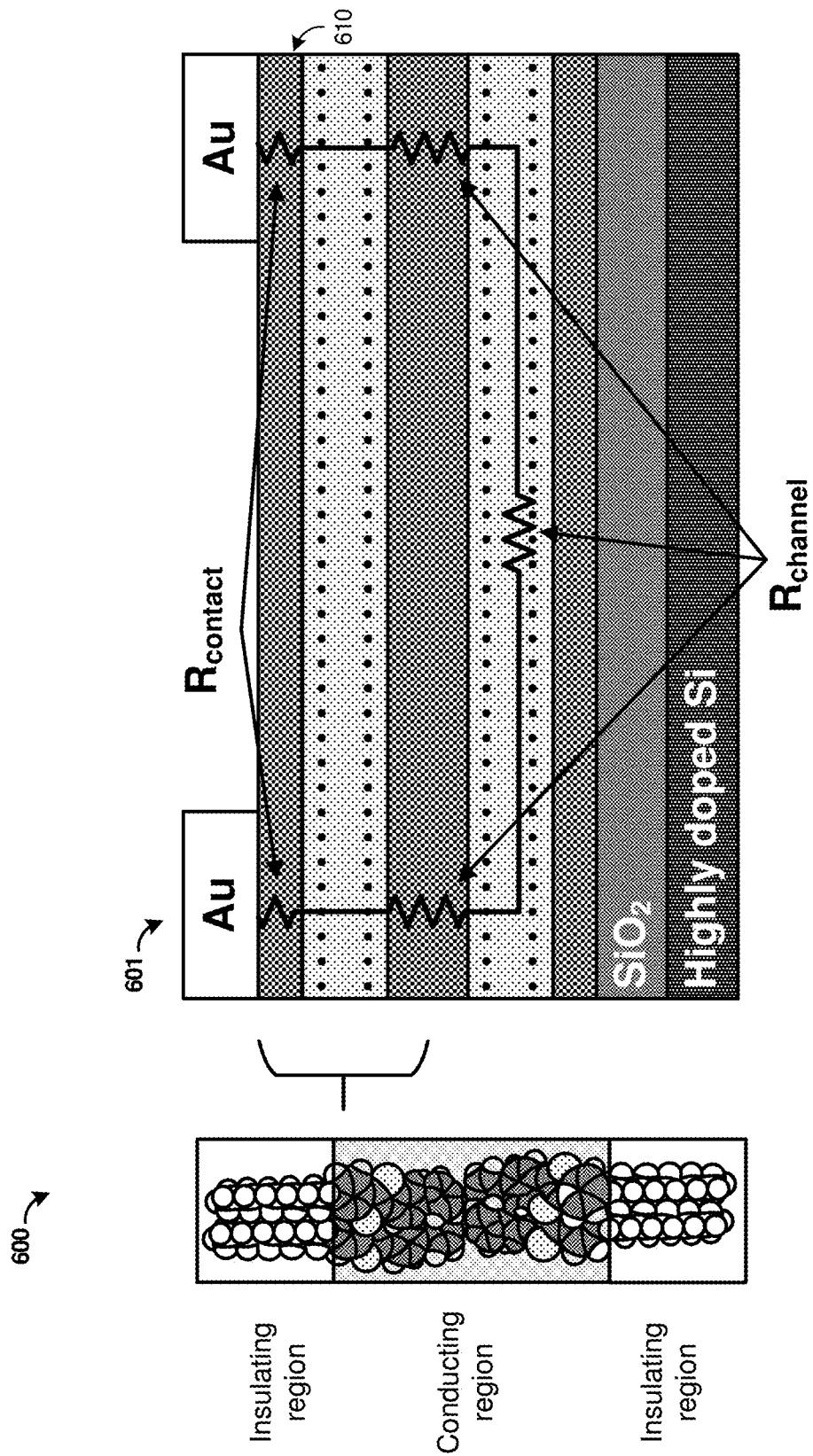
FIG. 6 illustrates semiconductor device characterization in an implementation.

FIG. 6 illustrates a resistive circuit schematic representation 600 of a corrugated dielectric FET and a cross-sectional view 601 of corrugated dielectric FET 610 with the resistances annotated thereon. The total resistance in corrugated dielectric FET 610 has three main components: two contact resistances ($R_{contact}$) from source and from drain, and resistance from semiconductor channel ($R_{channel}$). Usually, contact resistance is much larger than the semiconductor channel resistance. The contact resistance is the resistance that occurs in the interface between the contacting electrical leads and the semiconductor. The work function of gold (Au) used in the source/drain electrodes is 5.3 eV. The source Au injects charges (holes) into the highest occupied molecular orbital (HOMO) of the Ph-BTBT-10 semiconductor. The injected charges travel in the conducting region of the molecules near the interface of the dielectric and semiconductor to reach the drain Au. The semiconductor channel resistance is composed of 2 components: one is the resistance from the core of the bilayer (conducting region) and the other resistance is from the alkyl chains (insulating region) of the bilayer.

If contact resistance effects are neglected at the source-drain electrodes of corrugated dielectric FET 610, the on-current of corrugated dielectric FET 610 mainly depends on the mobility of the charges in the Ph-BTBT-10 semiconductor material and the capacitance of the gate dielectric. The off-current of corrugated dielectric FET 610 mainly depends on the gate leakage, conduction pathways at the substrate interface, and the bulk conductivity of the semiconductor material. The onset voltage in corrugated dielectric FET 610 was observed to be lower (18 V) that that of planar FET (20 V). The onset voltage (Von) comprises the voltage at which the drain current increases suddenly above a specific low off-current. The onset voltage is dependent mainly on the gate dielectric capacitance and the trap states at the dielectric-semiconductor interface. A lower onset voltage in the corrugated dielectric FET means that there are reduced number of trap states at the interface of the semiconductor and the dielectric, and requires lower power consumption to switch "on" the device.

FIG. 7 illustrates summary tables 700 and 701 for characterization of planar FET and corrugated dielectric FET devices. Table 700 lists on current, off current, onset voltage, threshold voltage and charge mobility characteristics of a planar FET and a corrugated dielectric FET with channel length of 200 μm and width of 4950 μm. Note that the on current, off current, onset voltage, and threshold voltage are listed in absolute values.

There could be several possible reasons for the effective increase in transconductance in the corrugated dielectric FET. One possible reason could be the increase in channel width, from W (in planar FET) to Weff=W(1+2h/s) (in corrugated dielectric FET). The total effective height of the trenches in the corrugated structure is heff=2hW/s. The total effective heights and effective channel widths for corrugated dielectric FETs with 1000 μm, 2000 μm and 4950 μm channel widths are given in table 701. Table 701 shows total effective heights and effective channel widths for corrugated dielectric FETs. As shown in table 701, the increase in channel width is only 0.2% for corrugated dielectric FETs compared to planar FETs, and is unlikely to be used to explain the large increase in the transconductance. The increase in effective channel width alone appears insufficient to explain the enhancement in drain currents, since the pitch is much larger than the height of the corrugations (s»h). Another possible reason for the enhancement in the drain current in the corrugated dielectric FETs is the increase in effective charge transport mobility in the channel over the edges of the corrugated structures. It is proposed that the lower charge density and lower electric field in the Ph-BTBT-10 semiconductor over the convex edge results in the reduced interaction between the holes and the dielectric-semiconductor interface. This enhances the effective mobility in the interface. The concave edge with higher charge carrier density per unit area and higher electric field help to fill interfacial traps quickly and the other remaining charge carriers become free to move through the semiconductor without trapping, in accordance with the trap-assisted charge carrier transport model.

In further testing, changing a dimension (width) in the corrugated structure does not significantly affect the electrical performance of the corrugated dielectric FETs. The charge mobility in the corrugated dielectric FETs are lower than the maximum charge mobility observed in Ph-BTBT-10 semiconductor material. One possible reason for this is the large thickness of the Ph-BTBT-10 semiconductor layer in the bottom-gate top-contact FETs. Since the Ph-BTBT-10 film is thicker, the injected holes in the source electrode have to travel larger distance (across many bilayers of Ph-BTBT-10 molecules) to reach the semiconductor-dielectric interface in which most of the charge transport occurs. The presence of alkyl chain sublayer in the Ph-BTBT-10 semiconductor material result in high access resistance which reduces the charge mobility.

Figure 8:
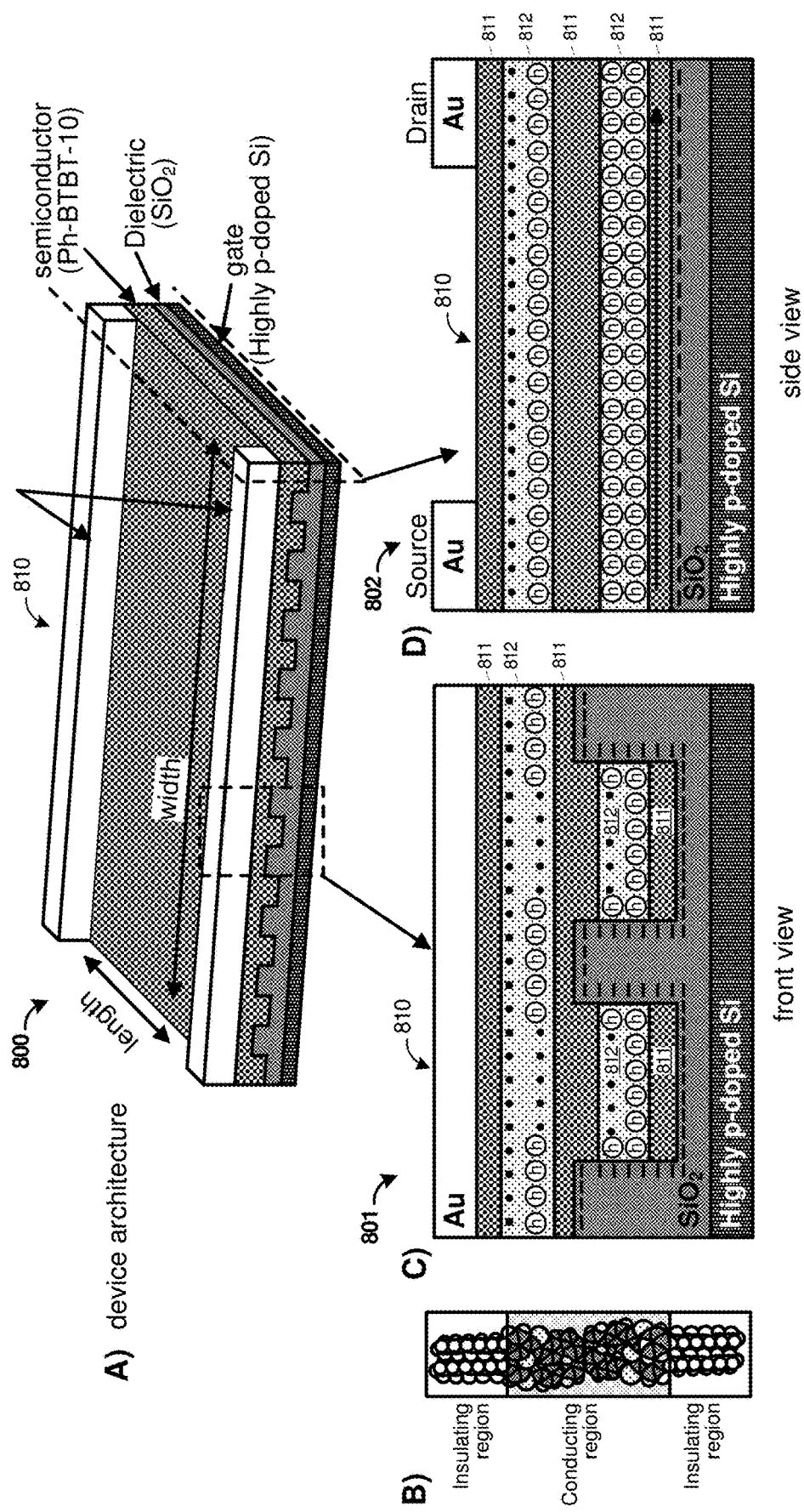
FIG. 8 illustrates semiconductor device operation in an implementation.

FIG. 8 illustrates further operation of corrugated dielectric FET device architectures. View 801 (*a*) illustrates an oblique view of a corrugated dielectric FET device 810, such as that seen in the previous Figures. View 801 (*b*) illustrates a front view of a bilayer structure with insulating regions 811 and conducting regions 812 of corrugated dielectric FET device 810. View 802 (*c*) illustrates a side view of a bilayer structure with insulating regions 811 and conducting regions 812 of corrugated dielectric FET device 810. The bilayer has homeotropic packing of Ph-BTBT-10 molecules. The holes (h) travel through conducting region 812 of the bilayer. Compared to planar FET devices, corrugated dielectric FET device 810 has more charge accumulation in the dielectric, enabling higher density of holes in the device. This results in higher drain current in corrugated dielectric FET device 810 as compared to planar FET devices. Empirical testing of corrugated dielectric FET devices discussed herein shows that x-ray beam diffraction intensity for Ph-BTBT-10 thin film on corrugated $SiO_2$ dielectric structures is much higher than the diffraction intensity for Ph-BTBT-10 thin film on planar $SiO_2$ dielectric structures. This is evidence for the formation of large and aligned domains of the semiconductor molecules which is induced by the corrugated surface and structures.

The functional block diagrams, operational scenarios and sequences, and flow diagrams provided in the Figures are representative of exemplary systems, environments, and methodologies for performing novel aspects of the disclosure. While, for purposes of simplicity of explanation, methods included herein may be in the form of a functional diagram, operational scenario or sequence, or flow diagram, and may be described as a series of acts, it is to be understood and appreciated that the methods are not limited by the order of acts, as some acts may, in accordance therewith, occur in a different order and/or concurrently with other acts from that shown and described herein. For example, those skilled in the art will understand and appreciate that a method could alternatively be represented as a series of interrelated states or events, such as in a state diagram. Moreover, not all acts illustrated in a methodology may be required for a novel implementation.

The descriptions and figures included herein depict specific implementations to teach those skilled in the art how to make and use the best option. For the purpose of teaching inventive principles, some conventional aspects have been simplified or omitted. Those skilled in the art will appreciate variations from these implementations that fall within the scope of the invention. Those skilled in the art will also appreciate that the features described above can be combined in various ways to form multiple implementations. As a result, the invention is not limited to the specific implementations described above, but only by the claims and their equivalents.

What is claimed is:

1. A method of forming a transistor structure, comprising:
    forming a dielectric layer onto a gate element;
    forming a first corrugated pattern with masking material on the dielectric layer;
    forming a sacrificial layer of metal oxide onto the first corrugated pattern and the dielectric layer;
    removing the masking material and at least a portion of sacrificial layer on the masking material to leave a patterning of the sacrificial layer defining corrugations on the dielectric layer; and
    with an atomic layer etching (ALE) process, etching the dielectric layer to a selected depth and concurrently removing the patterning of the sacrificial layer to form a corrugated surface;
    forming a semiconductor layer onto the corrugated surface; and
    forming a source element and a drain element onto the semiconductor layer.

2. The method of claim 1, wherein the dielectric layer comprises $SiO_2$, and wherein the semiconductor layer comprises an organic semiconductor material.

3. The method of claim 1, wherein a selected thickness of the sacrificial layer corresponds approximately to reaching the selected depth in the dielectric layer at completion of removal of the sacrificial layer.

4. The method of claim 1, wherein forming the sacrificial layer comprises an atomic layer deposition (ALD) process to deposit the metal oxide onto the first corrugated pattern and the dielectric layer.

5. The method of claim 4, wherein the ALD process includes deposition of the metal oxide with a binary reaction comprising repeated cycles among steps (a) to (d) to reach a selected thickness of the metal oxide, steps (a) to (d) comprising:
    (a) exposure to trimethylaluminum (TMA);
    (b) purge with inert gas;
    (c) exposure to water; and
    (d) purge with inert gas.

6. The method of claim 1, wherein etching to the selected depth with the ALE process comprises repeated cycles among steps (a) to (d) to reach the selected depth, steps (a) to (d) comprising:
    (a) exposure to trimethylaluminum (TMA);
    (b) purge with inert gas;
    (c) exposure to hydrogen fluoride (HF);
    (d) purge with the inert gas.

7. The method of claim 1, wherein the dielectric layer comprises $SiO_2$, wherein the metal oxide comprises $Al_2O_3$, and wherein the semiconductor layer comprises an organic semiconductor material.

8. The method of claim 1, wherein the selected depth comprises 20 nanometers (nm)+/−1 nm.

9. A method of forming a semiconductor structure, comprising:
    forming a dielectric layer;
    forming a first corrugated pattern with masking material on the dielectric layer;
    forming a sacrificial layer onto the first corrugated pattern and the dielectric layer;
    removing the masking material and at least a portion of sacrificial layer on the masking material to leave a second corrugated pattern of the sacrificial layer; and
    forming corrugations in the dielectric layer by at least atomic layer etching (ALE) the dielectric layer to a selected depth and concurrent with removing the second corrugated pattern.

10. The method of claim 9, wherein ALE to the selected depth comprises repeated cycles among steps (a) to (d) to reach the selected depth, steps (a) to (d) comprising:
    (a) exposure to trimethylaluminum (TMA);
    (b) purge with inert gas;
    (c) exposure to hydrogen fluoride (HF);
    (d) purge with the inert gas.

11. The method of claim 9, wherein forming the sacrificial layer comprises an atomic layer deposition (ALD) process to deposit a metal oxide of a selected thickness onto the first corrugated pattern and the dielectric layer.

12. The method of claim 11, wherein the selected thickness of the sacrificial layer corresponds approximately to reaching the selected depth in the dielectric layer at completion of removal of the sacrificial layer.

13. The method of claim 11, wherein the ALD process includes deposition of the metal oxide with a binary reaction comprising repeated cycles among steps (a) to (d) to reach a selected thickness of the metal oxide, steps (a) to (d) comprising:
   (a) exposure to trimethylaluminum (TMA);
   (b) purge with inert gas;
   (c) exposure to water; and
   (d) purge with inert gas.

14. The method of claim 9, further comprising:
   forming the dielectric layer onto a gate element;
   forming a semiconductor layer onto the dielectric layer after formation of the corrugations; and
   forming a source element and a drain element onto the semiconductor layer.

15. The method of claim 9, wherein the dielectric layer comprises $SiO_2$, and wherein the sacrificial layer comprises $Al_2O_3$.

16. A semiconductor structure, comprising:
   a dielectric layer;
   a corrugated surface formed into the dielectric layer using at least an atomic layer etching (ALE) process to remove portions of the dielectric layer; and
   a semiconductor layer formed onto the corrugated surface.

* * * * *